United States Patent [19]

Narizuka et al.

[11] Patent Number: 5,285,016
[45] Date of Patent: Feb. 8, 1994

[54] WIRING BOARD PROVIDED WITH A HEAT BYPASS LAYER

[75] Inventors: Yasunori Narizuka, Yokohama; Akihiro Kemmotsu, Fujisawa; Masakazu Ishino; Eiji Matsuzaki, both of Yokohama, Japan

[73] Assignee: Hitachi, Ltd., Tokyo, Japan

[21] Appl. No.: 618,407

[22] Filed: Nov. 27, 1990

[30] Foreign Application Priority Data

Nov. 27, 1989 [JP] Japan .................................. 1-307232

[51] Int. Cl.⁵ .............................................. H05K 1/00
[52] U.S. Cl. ..................................... 174/252; 361/688
[58] Field of Search ................ 174/252, 255, 256, 258, 174/262; 357/85; 361/381, 402, 410, 411

[56] References Cited

U.S. PATENT DOCUMENTS 3,617,816 11/1971 Riseman ........................... 357/85
4,782,381 11/1988 Ruby et al. .................. 361/402 X
4,993,148 2/1991 Adachi et al. ............... 174/252 X

FOREIGN PATENT DOCUMENTS 53-65969 11/1976 Japan ................................ 174/252

Primary Examiner—Leo P. Picard
Assistant Examiner—Cheryl R. Figlin
Attorney, Agent, or Firm—Antonelli, Terry, Stout & Kraus

[57] ABSTRACT

Disclosed herein are high density wiring boards useful in computers, communication equipment and the like. They include a layer for bypassing heat to be generated. Heat generated at a conductor and/or a resistor in each wiring board is allowed to spread out evenly via the heat bypass layer.

21 Claims, 3 Drawing Sheets

WIRING BOARD PROVIDED WITH A HEAT BYPASS LAYER

BACKGROUND OF THE INVENTION a. Field of the Invention

The present invention relates to a structure for a high density wiring board useful in computers, communication equipment or the like.

b. Description of the Related Art

The conventional structure of a wiring board with insulation layers is shown in FIG. 2A. In the conventional structure, as depicted in the drawing, an organic insulation layer 2 and a conductor 4, which have been subjected to patterning, are laminated on a substrate 1, and another organic insulation layer 2a having holes therein, another conductor 4a to which patterning has been applied, and a further organic layer 2b are laminated further on the organic insulation layer 2 and the conductor 4.

When circuits are formed in multiple layers, the above structure however involves the problem that cracks 7 are formed as illustrated in FIG. 2B. In the step in which the upper conductive layer 4a or the middle organic insulation layer 2a are formed, shape-attributed large stress 6 may often be applied to the underlying conductor, the insulation layer and the like in the directions as indicated by arrows 12 in FIG. 2B. As a result, cracks may be formed at the areas of bonding between pattern edge portions 13 and 14 of the respective conductive layers and their associated underlying layers. The cracks 7 may be formed in layers such as the organic insulation layers 2 and 2a and the conductive layer 4 as indicated in FIG. 2B.

When such a crack 7 is formed in the conductive layer 4 or the organic insulation layers 2 and 2a, the state of contact at the cracked portion varies upon passing a current or under vibrations so that noise may be generated or disconnection may take place. This may lead to problems such as the fabrication yield being reduced and the product reliability being lowered.

As a means for overcoming the above problems, a technique has been disclosed in Japanese Patent Laid-Open No. 61-12357. The structure of a wiring board according to the above technique is shown in FIG. 3. The wiring board according to this conventional technique has the structure that a stress supportable layer 5 made of $Ta_2O_5$ or $SiO_2$ is provided between an organic insulation layer 2 and a conductive layer 4. An additional stress supportable layer 5a is also interposed between another organic insulation layer 2a and another conductive layer 4a. These stress supportable layers 5 and 5a make it possible to withstand thermal stress produced during the steps in which insulation layers are to be formed on the stress supportable layers 5 and 5a respectively.

The stress supportable layers according to the conventional technique are effective as layers for withstanding thermal stress. The conventional technique is however accompanied by the following problem. Such a wiring board may internally give off heat when a current of electricity is fed to the board. No consideration whatsoever is however taken for such heat in the above conventional technique.

Referring back to FIG. 3, a description will be made of a case in which such heat has been produced. In FIG. 3, the stress supportable layer 5 is provided between the organic insulation layer 2 and the conductive layer 4, both of which are formed on a substrate 1. Further, the stress supportable layer 5a is provided between the organic insulation layer 2a and the conductive layer 4a.

These stress supportable layers 5 and 5a can withstand thermal stress to be produced in the steps in which overlying insulation layers will be formed respectively. However, no consideration is made for the diffusion of heat to be produced during feeding of electrical power to the substrate. Due to localized generation of heat in the course of the feeding of the electrical power, heat will be accumulated in the stress supportable layers 5 and 5a and organic insulation layers 2 and 2a so that the temperature of these layers will arise. As a result, these layers will develop a thermal expansion as indicated at numeral 11. Due to a difference in the coefficient of thermal expansion between these layers, cracks and separation occur in the stress supportable layer 5. In addition, cracks and the like also take place in the conductive layer 4. They are indicated as cracks 7 in FIG. 3.

Therefore, the wiring board described above would have low reliability. Further, a product making use of this wiring board, such as a computer, is prone to trouble or malfunction.

SUMMARY OF THE INVENTION

An object of the present invention is to provide a high-reliability wiring board which is free from cracks or disconnection of a conductor, a resistor and/or the like.

The above object can be achieved by providing a heat bypass between an insulation layer and a conductive layer so as to permit two-dimensional diffusion and release of the heat produced during the supply of electric power.

In the case of a wiring board provided with an electrical resistance layer, the above object can be attained by interposing a heat bypass between the electrical resistance layer and an insulation layer.

If mechanical strength gives rise to trouble in a fabrication process, the above object can be fulfilled by arranging a layer which can support stress produced between laminated layers.

The greater the thickness of the heat bypass, the more effective in mechanical strength and heat diffusion. It is however appropriate to form the heat bypass to a thickness of about 0.2–1.0 $\mu m$ in view of the fabrication cost, the processing to be applied after the formation of the heat bypass, etc.

Further, the use of the above-described multilayer high density wiring board provided with the heat bypass, as a circuit unit in a computer, communication equipment or the like, makes it possible to avoid trouble or malfunction and hence to improve the reliability of the wiring board.

In the wiring board according to the present invention, heat which is locally generated in the wiring board while its power supply is on is allowed to evenly diffuse out through the heat bypass, so that the heat is released.

It is therefore possible to avoid localized accumulation of heat at a portion of an insulation layer, electrical resistor or the like, whereby the insulation layer is prevented from being heated to a temperature higher than its glass transition temperature. Accordingly, even if there is a difference in the coefficient of thermal expansion between the insulation layer and a conductor or the like, the circuit or the like does not form cracks and is not deteriorated in function by partial expansion of the insulation layer, the conductor or the like.

Especially, when an electrical resistor, which will become a principal heat generating source, is provided on the heat bypass, it is possible to evenly diffuse and release, via the heat bypass, heat to be generated at the electrical resistor. No partial expansion is therefore produced by localized accumulation of heat in the electrical resistor or the insulation layer. Cracking or the like of the circuit therefore does not take place. Accordingly, the reliability of a multilayer high density wiring board with an electrical resistor internally provided therein will not be reduced according to the present invention.

Further, when a layer for supporting stress to be produced between an insulation layer and a conductor is provided on a wiring board, stress to be applied during the fabrication steps will be supported by the layer having relatively high strength. No strong stress will therefore be applied to the insulation layer or to the conductor. It is therefore possible to avoid breakage or the like of the conductor and the electrical resistor during the fabrication steps by thermal stress to be produced during the fabrication steps.

According to the present invention, heat to be produced in the wiring board while the power supply is on is evenly transmitted and diffused to an area broader than a heat-generating portion by way of the layer having high thermal conductivity. It is hence possible to avoid localized accumulation of heat and disconnection or the like of wirings and/or electrical resistors, which disconnection or the like would otherwise take place by thermal stress to be caused by a temperature increase due to accumulation of heat.

Further, the use of the multilayer wiring board of this invention is a computer, communication equipment or the like makes it possible to improve its reliability.

DETAILED DESCRIPTION OF THE PREFERRED EMBODIMENTS

A description will be made of the first embodiment of the present invention.

FIGS. 1A, 1B, 1C and 1D are cross-sectional views of the multilayer wiring board in the various fabrication stages. The figures will be referred to for describing the multilayer wiring board according to the first embodiment of the present invention.

Figure 1A:
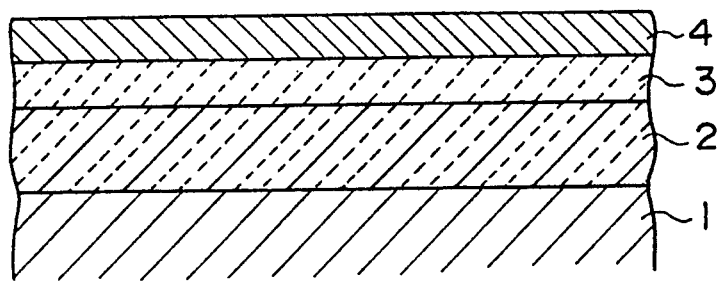
FIGS. 1A, 1B, 1C and 1D are cross-sectional views of a multilayer wiring board according to a first embodiment of the present invention in various stages of its fabrication.
Figure 1B:
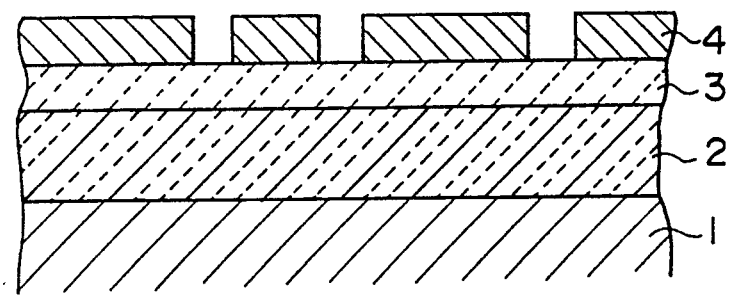
Figure 1C:
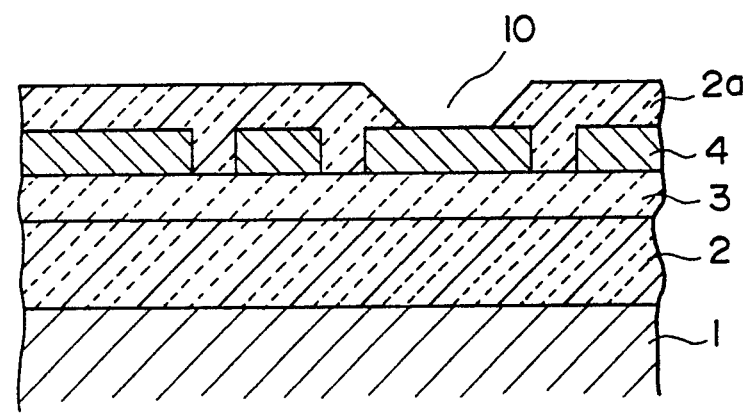
Figure 1D:
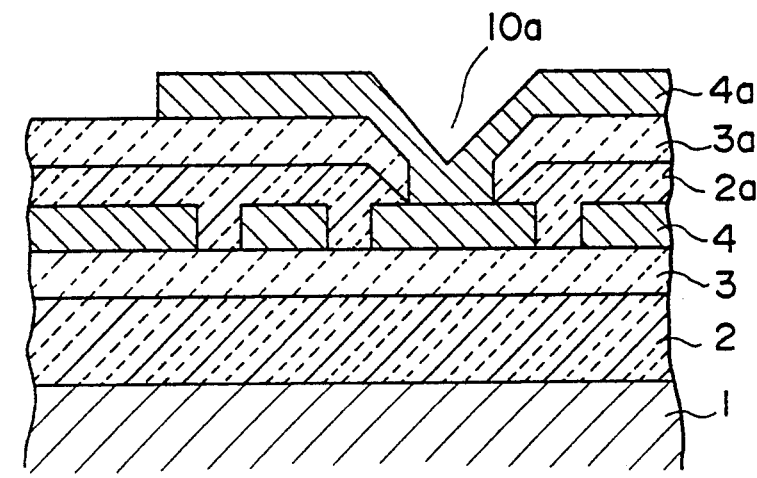
Figure 2A:
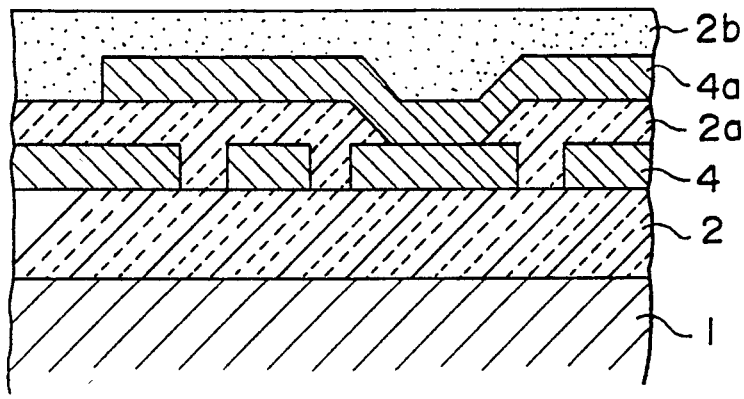
FIG. 2A is a cross-sectional view of a conventional multilayer wiring board.
Figure 2B:
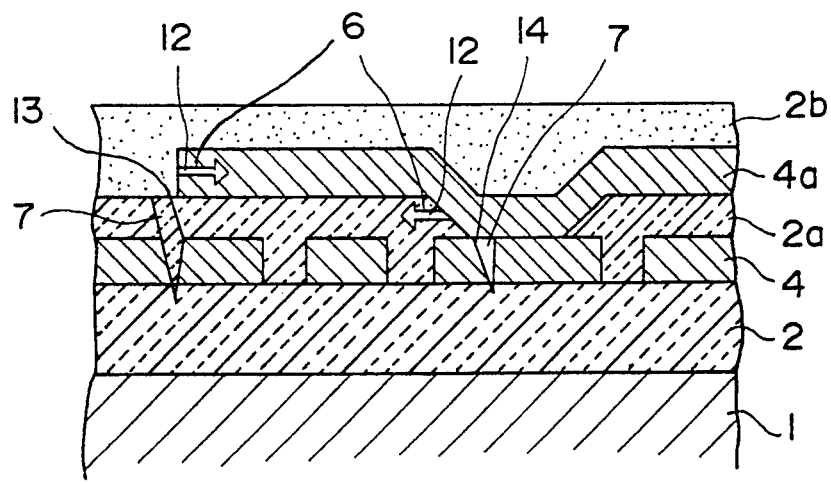
FIG. 2B is a cross-sectional view showing the state of stress and cracking in a fabrication step of a conventional multilayer wiring board.
Figure 3:
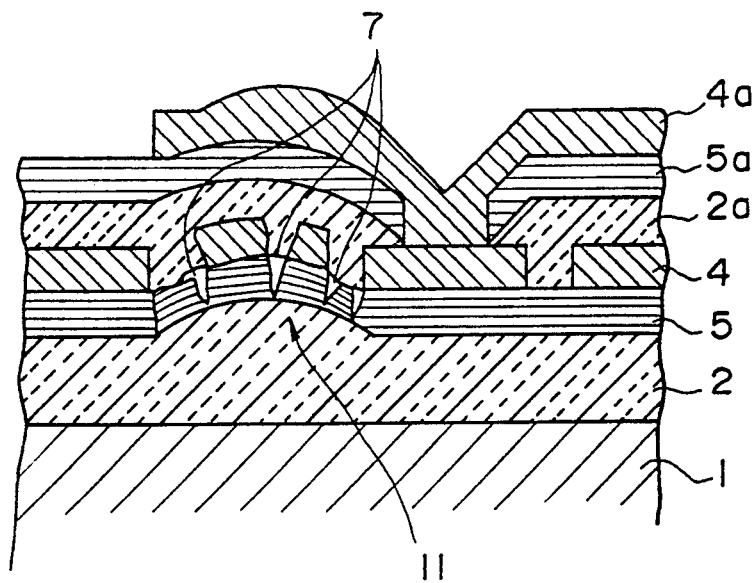
FIG. 3 is a cross-sectional view illustrating cracks in a conductor and a stress supportable layer in a multilayer wiring board having the stress supportable layer.

FIG. 1D is a fragmentary cross-sectional view of the wiring board of this embodiment in the final fabricate stage. In the figure, the wiring board according to this embodiment has an organic insulation layer 2 made of an organic material such as a polyimide-varnish and formed on a substrate 1. On the organic insulation layer 2, a heat bypass layer made of Si and having a thickness of 0.2 $\mu$m–10 $\mu$m is formed. Formed on the thermal bypass layer 3 is a conductive layer 4 etched in a desired configuration.

Further, formed successively are an organic insulation layer 2a on the conductive layer 4, a heat bypass layer 3a on the organic insulation layer 2a, and a conductive layer 4a on the heat bypass layer 3a. A through-hole 10a is formed through the organic insulation layer 2a and the heat bypass layer 3a at the same places, so that the conductor 4a, an upper layer, is connected to the underlying conductor 4.

Si was chosen as a material for the heat bypass layers for the following reasons. Properties required as a heat bypass layer include good thermal conductivity, low coefficient of thermal expansion, relatively high mechanical strength, etc. The thermal conductivity of Si is as good as 0.2 cal/cm.deg, the coefficient of thermal expansion of Si is relatively low, i.e., $9.6 \times 10^{-6}/°C.$, and the mechanical strength of Si is comparable with $SiO_2$. Si can therefore satisfy the properties referred to above and is suitable as a material for heat bypass layers.

Generally, Si is however also employed as a conductive material in LSI's and the like. Formation of an Si layer as a heat bypass layer under a circuit therefore have a potential problem in passing a current of electricity. It is however possible to raise its resistivity to about $2 \times 10^{10}$ $\mu\Omega$.cm or higher by controlling its impurity level low. Compared with the resistivity of Cu or Al which is on the order of several $\mu\Omega$.cms, the resistivity of such an Si layer is much higher and causes no problem in passing a current of electricity through the circuit.

In addition to Si, other materials having good thermal conductivity and also high mechanical strength—such as $Al_2O_3$, W, Ta, Cu and Ni—can also be used as materials for heat bypass layers.

Regarding the thickness of each of the above heat bypass layers, a thicker layer is more effective from the standpoints of strength and heat radiation. However, a thickness of 0.2 $\mu$m to 10 $\mu$m is suitable in view of the time required for the formation of the layers and post processing such as the formation of through-holes.

The heat bypass layer has a surface wider than a surface at which the heat bypass layer receives heat from a heat-generating portion.

A description will next be made of an exemplary fabrication process of the multilayer wiring board of this embodiment.

FIG. 1A shows a first stage of the fabrication process. The first stage comprises the following steps:

(1) An organic coating formation such as a polyimide-varnish is coated on the substrate 1 which is made of a ceramic, metal or organic material. The coated substrate is baked to form the organic insulation layer 2 having a smooth surface.

(2) On the organic insulation layer 2, an Si layer is then formed as the heat bypass layer 3 to a thickness of 0.2–10 $\mu$m by conventional sputtering.

(3) On the heat bypass layer 3, the conductive layer 4 which is made of Al or Cu is formed to a thickness of 1–5 $\mu$m by sputtering.

A second stage will now be described with reference to FIG. 1B. The second stage includes the step that the conductive Al or Cu layer 4 is subjected to etching in accordance with photolithography, which is a conventional, etching technique, to form a circuit pattern, namely, wiring of the conductive material.

Referring next to FIG. 1C, a third stage will be described. The third stage includes the step that a polyimide-varnish is coated on the conductive layer 3 and the heat bypass layer 3 is baked to form the organic insulation layer 2a. The through-hole 10 is then formed by photolithography which is a conventional technique.

Next, a fourth stage will be described with reference to FIG. 1D. In the fourth stage, the heat bypass layer 3a is formed firstly on the organic insulation layer 2a which defines the through-hole 10 therein. Next, by the photolithography technique, the through-hole 10a is formed in the heat bypass layer 3a. The conductive Al or Cu layer is thereafter formed on the heat bypass layer 3a by sputtering. A circuit pattern is then formed by photolithography in a similar manner to that described above.

Through the series of steps described above, the two-layer wiring board is provided with the heat bypass layers 3 and 3a. By repeating similar steps, a desired multilayer wiring board can be obtained.

The multilayer wiring board fabricated by the process described above allows heat, which is produced in the board while an associated power supply is maintained on, to evenly diffuse and spread out through the heat bypass layers without localized accumulation.

It is therefore possible to prevent formation of cracks which would otherwise occur due to the differences in the coefficient of thermal expansion between the organic insulation layers 2 and 2a and the corresponding conductive layers 4 and 4a. In addition, the organic insulation layers are not heated beyond their glass transition temperature. As a result, various inconvenience such as cracking are not encountered so that the multilayer wiring board can be obtained with high reliability.

Figure 4:
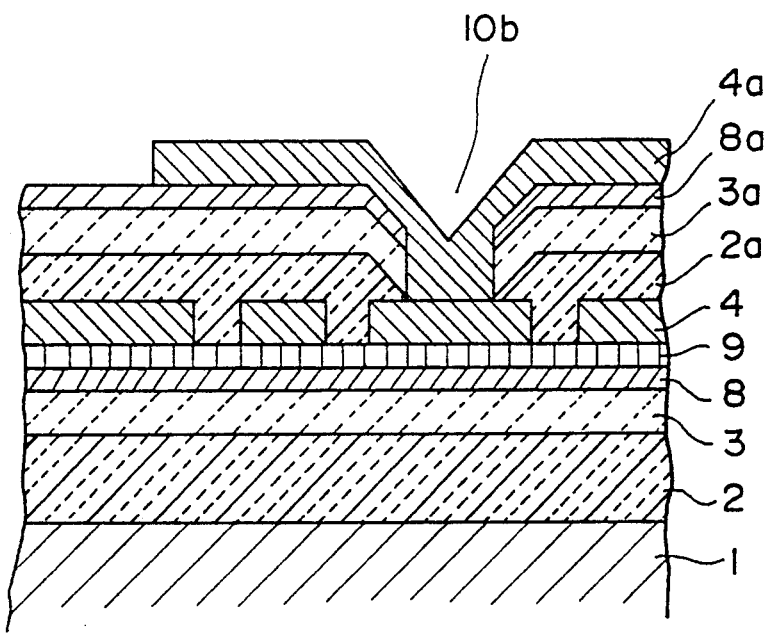
FIG. 4 is a cross-sectional view of a multilayer wiring board according to a second embodiment of the present invention.

FIG. 4 is a cross-sectional view showing a multilayer wiring board according to a second embodiment of the present invention. In the wiring board of the second embodiment, the organic insulation layer 2 made from an organic coating formulation such as a polyimide-varnish is formed on the substrate 1. The heat bypass layer 3 made of Si and having a thickness of 0.2 $\mu$m to 10 $\mu$m is formed on the organic insulation layer 2. On the heat bypass layer 3, an $Si_3N_4$ layer 8 is formed as a stress supportable layer to a thickness of about 50 nm on the heat bypass layer 3. On the $Si_3N_4$ layer 8, an electrical resistance layer 9 composed primarily of a material such as Cr or W is formed as a resistor. In addition, the conductive layer 4 made of Al, Cu or the like is formed on the electrical resistance layer 9.

On these layers, the organic insulation layer 2a, the heat bypass layer 3a, an $Si_3N_4$ layer 8a and the conductive layer 4a are successively formed one over another. A through-hole 10b is formed through the upper organic insulation layer 2a and heat bypass layer 3a at the same location, so that the upper conductive layer 4a is connected to the lower conductive layer 4.

$Si_3N_4$, $SiO_2$, $Al_2O_3$ or the like can also be used as a material for the stress supportable layers. When $Al_2O_3$ is employed for the stress supportable layer, the layer is preferably formed as thick as 10 to 20 $\mu$m.

A description will next be made of an exemplary fabrication process for the multilayer wiring board of the second embodiment.

Referring to FIG. 4, an organic coating formulation such as a polyimide-varnish is coated on the substrate 1 made of a ceramic, a metal or the like, followed by baking to form the organic insulation layer 2 having a smooth surface. On the surface of the organic insulation layer 2, an Si layer is then formed as the heat bypass layer 3 according to conventional sputtering. On the surface of the heat bypass layer 3, the $Si_3N_4$ layer 8 is formed to a thickness of about 50 nm by conventional RF sputtering. On the surface of the $Si_3N_4$ layer 8, the electrical resistance layer 9 composed primarily of a material such as Cr or W is formed by conventional sputtering. Further, the conductive Al or Cu layer is formed on the surface of the electrical resistance layer 9. The electrical resistance layer 9 and the conductive layer 4 are formed into a resistor and a wiring by photolithography which is a conventional technique. On these layers, in a similar manner to that described above, the organic insulation layer 2a, the heat bypass layer 3a, the $Si_3N_4$ layer 8a and the conductive layer 4a are successively formed one over another to obtain the desired multilayer wiring board.

The heat bypass layers 3 and 3a in this embodiment act in much the same way as the heat bypass layers in the first embodiment described above.

The $Si_3N_4$ layers 8 and 8a can prevent deformation and/or cracking of the conductive layers and electrical resistance layer due to thermal stress which is produced in the course of the fabrication process. Since the $Si_3N_4$ layers 8 and 8a are electrical insulators, they can achieve the electrical insulation between the heat bypass layer 3 and the electrical resistance layer 9 and also the electrical insulation between the heat bypass layer 3a and the conductive layer 4a. They are also effective in preventing mutual diffusion of the electrical resistance layer 9 and the heat bypass layer 3 and hence in protecting the resistor from deterioration.

Accordingly, like the first embodiment, the second embodiment can prevent temperature-dependent variations of the resistance and occurrence of cracks due to the differences in the coefficient of thermal expansion between the organic insulation layers 2 and 2a and also their corresponding conductive layers 4 and 4a. In addition, owing to the inclusion of the $Si_3N_4$ layers 8 and 8a, the interlayer mechanical strength and electrical insulation has been improved and the possible deterioration of the resistor has been avoided, whereby the multilayer wiring board has been obtained with still higher reliability.

The above multilayer wiring boards can be used, for example, as multilayer high density wiring boards for super computers.

What is claimed is:

1. A wiring board comprising:
   a substrate, insulation layers formed on said substrate, a current-passing layer disposed between said insulation layers for an electrical current to flow therethrough, and a heat bypass layer provided at a position in proximity to at least a part of said current-passing layer and in contact with one of said insulation layers.

2. A wiring board according to claim 1, wherein said current-passing layer comprises at least a conductive layer and, wherein said heat bypass layer is provided in said proximity of the conductive layer.

3. A wiring board according to claim 1, wherein said current-passing layer comprises at least an electrical resistance layer and wherein said heat bypass layer is provided in the proximity of said electrical resistance layer.

4. A wiring board according to claim 1, wherein said current-passing layer comprises at least an electrical resistance layer and said heat bypass layer is formed between said electrical resistance layer and one of said insulation layers, whereby heat generated in said electrical resistance layer is radiated.

5. A wiring board according to claim 1, wherein said heat bypass layer is formed in the proximity of a portion of said current-passing layer, wherein heat is generated at a temperature higher than a glass transition temperature of said insulation layers at said portion.

6. A wiring board according to claim 1, wherein said heat bypass layer has a surface wider than a surface of said current-passing layer.

7. A wiring board according to claim 4, wherein an heat bypass layer is provided over an area greater than an area of contact between said heat bypass layer and said electrical resistance layer.

8. A wiring board comprising:
a substrate;
insulation layers formed on said substrate;
a current-passing layer disposed between said insulation layers for an electrical current to flow therethrough; and
a heat bypass layer provided at a position in proximity to at least a part of said current-passing layer and in contact with one of said insulation layers,
wherein said current-passing layer comprises at least an electrical resistance layer and one of said heat bypass layers is formed between said electrical resistance layer and said insulation layer, whereby heat generated in said electrical resistance layer is radiated, and
wherein a layer for supporting stress is provided between said heat bypass layer and said electrical resistance layer.

9. A wiring board according to claim 8, wherein said stress supporting layer may be formed on an upper surface of said heat bypass layer.

10. A wiring board comprising:
a substrate;
insulation layers formed on said substrate;
a current-passing layer disposed between said insulation layers for an electrical current to flow therethrough; and
a heat bypass layer provided at a position in proximity to at least a part of said current-passing layer and in contact with one of said insulation layers,
wherein said heat bypass layer is formed in the proximity of a portion of said current-passing layer, wherein heat is generated at a temperature higher than a glass transition temperature of said insulation layers at said portion, and
wherein a layer for supporting stress is provided on an upper surface of said heat bypass layer, said layer provided in the proximity of said portion at a temperature higher than the glass transition temperature of the insulation layer.

11. A wiring board according to claim 1, one of said insulation layers corresponds to a polyimide-varnish.

12. A wiring board according to claim 1, wherein said heat bypass layer is made of Si.

13. A wiring board according to claim 1, wherein a thickness of said heat bypass layer is 0.2–10 μm.

14. A wiring board comprising:
a substrate;
an insulation layer laminated on said substrate;
a conductive layer laminated on said insulation layer;
an electrical resistance layer laminated on said conductive layer; and
heat bypass means, formed between said insulation layer and said electrical resistance layer, for radiating heat generated in said electrical resistance layer.

15. A wiring board according to claim 14, wherein said heat bypass means is made of Si.

16. A wiring board according to claim 14, wherein the thickness of said heat bypass means is 0.2–10 μm.

17. A wiring board comprising: a substrate, an insulation layer laminated on said substrate, an $Si_3N_4$ layer, an Si layer disposed between said insulation layer and said $Si_3N_4$ layer, an electrical resistance layer, and a conductor proximate to electrical resistance layer, said $Si_3N_4$ being disposed between said Si layer and said electrical resistance layer.

18. A wiring board comprising:
a substrate;
an insulation layer laminated on said substrate;
an $Si_3N_4$ layer;
an Si layer disposed between said insulation layer and said $Si_3N_4$ layer;
an electrical resistance layer; and
a conductor proximate to said electrical resistance layer, said $Si_3N_4$ layer being disposed between said Si layer and said electrical resistance layer,
wherein said conductor defines windows therein, said insulation layer is laminated over said windows and said conductor, said Si layer, said $Si_3N_4$ layer and said electrical resistance layer, wherein a further conductor is laminated on said insulation layer.

19. A wiring board according to claim 17, wherein the thickness of said Si layer is 0.2–10 μm.

20. A wiring board comprising:
a substrate, insulation layers formed on said substrate, a current-passing layer disposed between said insulation layers for causing electrical current to flow therethrough, and a heat bypass layer provided at a position in proximity of at least a part of said current-passing layer and in contact with one of said insulation layers, wherein said heat bypass layer is a non-conductor.

21. A wiring board comprising:
a substrate;
insulation layers formed on said substrate;
a current-passing layer disposed between said insulation layers for an electrical current to flow therethrough; and
a heat bypass layer provided at a position in proximity to at least a part of said current-passing layer and in contact with one of said insulation layers,
said heat bypass layer having a thermal conductivity greater than a thermal conductivity of said insulation layers, and
said heat bypass layer having an electrical resistivity greater than an electrical resistivity of said current-passing layer.

* * * * *